United States Patent [19]

Kikkawa et al.

[11] Patent Number: 5,460,654
[45] Date of Patent: Oct. 24, 1995

[54] APPARATUS FOR GENERATING RAW MATERIAL GAS USED IN APPARATUS FOR GROWING THIN FILM

[75] Inventors: Toshihide Kikkawa; Hitoshi Tanaka; Hirosato Ochimizu, all of Kawasaki, Japan

[73] Assignee: Fujitsu Limited, Kawasaki, Japan

[21] Appl. No.: 84,020

[22] Filed: Jun. 30, 1993

[30] Foreign Application Priority Data

Jul. 1, 1992 [JP] Japan .................. 4-174001

[51] Int. Cl.⁶ .................................................. C23C 16/00
[52] U.S. Cl. .................................................. 118/726
[58] Field of Search .................. 427/248.1, 255, 427/255.1, 255.2, 255.3; 118/715, 726

[56] References Cited

U.S. PATENT DOCUMENTS

| | | | |
|---|---|---|---|
| 4,659,401 | 4/1987 | Reif et al. | 148/175 |
| 4,717,596 | 1/1988 | Barbee et al. | 427/248.1 |
| 4,791,005 | 12/1988 | Becker et al. | 427/255.3 |
| 4,874,634 | 10/1989 | Easton et al. | 427/255.2 |
| 4,921,722 | 5/1990 | Osada et al. | 427/39 |
| 4,980,204 | 12/1990 | Fujii et al. | 427/255.2 |
| 5,160,542 | 11/1992 | Mihira et al. | 118/715 |
| 5,322,710 | 6/1994 | Visser | 427/248.1 |
| 5,324,386 | 6/1994 | Murakami et al. | 117/98 |

FOREIGN PATENT DOCUMENTS 2-255595  10/1990  Japan .

*Primary Examiner*—George Fourson
*Assistant Examiner*—Brian K. Dutton
*Attorney, Agent, or Firm*—Staas & Halsey

[57] ABSTRACT

In an apparatus for forming a film of MOCVD, gas source MBE or the like, there is provided a gas supply pipe for supplying gas obtained by gasifying a liquid or solid organic metal raw material to a reaction chamber. A mechanism in which a pressure gauge is fitted in the vicinity of a gas generating source in the gas supply pipe and the gas supply quantity from the gas generating source is regulated based on an indicated value of the pressure gauge so as to suppress variation of the gas pressure is installed in the apparatus for forming a film.

There is a heating system for heating the organic metal raw material or an ultrasonic vibrator for applying ultrasonic vibration to the organic metal raw material as the mechanism for regulating the gas supply quantity, and the gasified quantity of the organic metal raw material is varied by regulating the heating temperature of the heating system or by varying the output of the ultrasonic vibrator.

18 Claims, 16 Drawing Sheets

TBP 600cc/min.
HAZE AVG. TOTAL 8ppm

TBP 50cc/min.
HAZE AVG. TOTAL 56ppm

APPARATUS FOR GENERATING RAW MATERIAL GAS USED IN APPARATUS FOR GROWING THIN FILM

BACKGROUND OF THE INVENTION

1. Field of the Invention

The present invention relates to an apparatus for generating raw material gas used in apparatus for growing thin film, and this apparatus for forming a film is used for manufacturing a compound semiconductor device such as a semiconductor laser, a high electron mobility transistor (HEMT) and a Metal-Semiconductor FET (MESFET).

2. Description of the Related Art

Hydride gas such as arsine and phosphine has been used as a material of a V group element in a process of growing a compound semiconductor layer. Since these gases are sealed under a high pressure, they are in danger of explosion, and there is a problem in point of a safety measure because of highly poisonous character thereof. Thus, it is not easy to handle those gases.

Therefore, a liquid organic V group raw material which is in a liquid state at room temperature and has low toxicity is attracting public attention. A method of bubbling a liquid organic V group raw material by gasified hydrogen is generally adopted in order to gasify the liquid organic V group raw material.

A structure of an apparatus for growing a compound semiconductor film in which such a method is adopted is shown in FIG. 1.

In FIG. 1, a reference numeral 1 represents a main hydrogen supply pipe, 2a to 2c represent diluting hydrogen supply pipes, 3a and 3c represent bubbling hydrogen supply pipes, 4a to 4g represent mass flow controllers, 5 represents a valve for saving gas flow or for switching a flow passage, 6A–6C represents a thermostatic tank, 7a represents a first cylinder for containing liquefied tertial butyl phosphina (hereinafter referred to as TBP), 7b represents a second cylinder for containing liquefied trimethyl indium (hereinafter referred to as TMIn), 7c represents a third cylinder for containing liquefied triethyl gallium (hereinafter referred to as TEGa), 8 represents a barrel type reaction chamber, 9 represents a substrate on which a film is formed, 10 represents a pressure gauge, 11 represents a pressure control valve for regulating the pressure of the reaction chamber 8, 12 represents an exhaust pump, 13 represents a scruber and 14 represents an exhaust pipe.

Next, the operation for growing an InGaP film on the substrate 9 using this apparatus will be described. Besides, the items (1) to (4) described hereunder are operated in parallel with one another.

(1) First supply system of organic metal raw material gas

The flow rate of bubbling hydrogen supplied from the bubbling hydrogen supply pipe 3a is controlled by the mass flow controller 4c, and the controlled bubbling hydrogen is discharged into the TBP liquid in the first cylinder 7a, thereby to perform bubbling, and the TBP gas thus obtained is supplied into the barrel type reaction chamber 8. The TBP liquid is maintained at constant temperature by the thermostatic tank 6A.

Further, the flow rate of diluting hydrogen supplied from the diluting hydrogen supply pipe 2a is controlled by a mass flow controller 4b, and the controlled diluting hydrogen is supplied to a flow passage of TBP gas and introduced into the barrel type reaction chamber 8.

(2) Second supply system of organic metal raw material

The flow rate of bubbling hydrogen supplied through the bubbling hydrogen supply pipe 3b is controlled by the mass flow controller 4e, and the controlled bubbling hydrogen is discharged into the TMIn liquid in the second cylinder 7b thereby to perform bubbling, and the TMIn gas thus obtained is supplied into the barrel type reaction chamber 8. The TMIn liquid is maintained at constant temperature by the thermostatic tank 6b.

Further, the flow rate of diluting hydrogen supplied through the diluting hydrogen supply pipe 2b is controlled by the mass flow controller 4e, and the controlled diluting hydrogen is supplied to a flow passage of TMIn gas and introduced into the barrel type reaction chamber 8.

(3) Third supply system of organic metal raw material

The flow rate of bubbling hydrogen supplied through the bubbling hydrogen supply pipe 3c is controlled by the mass flow controller 4g, and controlled bubbling hydrogen is discharged into a TEGa liquid in the third cylinder 7c thereby to perform bubbling, and the TEGa gas is supplied into the barrel type reaction chamber 8 with hydrogen as carry gas. The TEGa liquid is maintained at constant temperature by the thermostatic tank 6c.

Further, the flow rate of diluting hydrogen supplied through the diluting hydrogen supply pipe 2c is controlled by the mass flow controller 4f, and controlled diluting hydrogen is supplied to the flow passage of TEGa gas and introduced into the barrel type reaction chamber 8.

(4) Supply system of hydrogen only

Hydrogen supplied through the main hydrogen supply pipe 1 and the flow rate of which is controlled by the mass flow controller 4a is supplied into the barrel type reaction chamber 8 having the pressure gauge 10.

In respective gas supply systems described above, valves 5 for saving gas flow and switching the flow passage are provided at important positions of the gas pipes serving as flow passages of gases such as hydrogen, TBP, TMIn and TEGa.

With this, an InGaP film is grown on the substrate 9 installed in the barrel type reaction chamber 8.

The gas exhausted from the barrel type reaction chamber 8 by the exhaust pump 12 is made harmless by the scrubber 13 and exhausted outside through the exhaust pipe 14.

Now, when an InGaP film is grown by using the above-described apparatus for growing a compound semiconductor, the TBP liquid in the first cylinder 7a for TBP is maintained at 10° C. by the thermostatic tank 6a. When the flow rate of bubbling hydrogen discharged therein is set to 500 cc/min, the rate of the group V element to the group III element (hereinafter referred to a V/III ratio) in the reaction chamber 8 reaches only to approximately 10, and a partial pressure of phosphorus (P) sufficient for growing an InGaP film having good film quality is unobtainable. Under such a condition, evenness of the InGaP film on the substrate 9 is decreased, and the surface thereof gets slightly opaque.

Further, in order not to lower the growth speed of the InGaP layer, the V/III ratio in the reaction chamber 8 has to be made 100 in the reaction chamber 8. It is conceivable to connect about 10 pieces of the first cylinders 7a for TBP in parallel as means for achieving the foregoing. Namely, such a method that a plurality of the first cylinders 7a are prepared, bubbling is performed in respective cylinders 7a, and the TBP gas is supplied in parallel at the same time from respective cylinders 7a may be adopted, however, the cost is increased remarkably and the apparatus becomes large in size according to this method.

Since the takeoff quantity of the organic group V raw material gas is small in the bubbling unit such as described above, only one mass flow controller can be provided in one bubbler which contains the liquid organic group V raw material. Therefore, a plurality of bubblers have to be installed in case those layers that require different compositions are continuous.

Further, in the bubbling method, the takeoff quantity of the raw material is unstable, and moreover, it takes a long period of time until the flow rate is stabilized after the flow rate is changed.

Instability of the takeoff quantity by bubbling is shown in FIG. 2. FIG. 2 shows a state that the takeoff quantity of TBP varies when bubbling is performed by supplying bubbling hydrogen at a flow rate of 200 cc/min into the TBP liquid. The axis of abscissas shows elapsed time of film growth, and the axis of ordinates shows an actual flow rate of TBP.

According to FIG. 2, it is realized that the actual flow rate of TBP fluctuates fractionally irrespective of the elapsed time of growth. Such fluctuation deteriorates the reproducibility of a growing semiconductor film, and more specifically the reproducibility of a condition for forming lattice match of a semiconductor layer and so forth.

Saturability of the takeoff quantity of TBP gas by bubbling is shown in FIG. 3. The axis of abscissas shows a set flow rate of TBP gas intended to obtain an increased supply quantity of bubbling hydrogen, and the axis of ordinates shows an actual flow rate which is practically obtainable from the first cylinder 7a.

When the TBP liquid is maintained at a temperature of 10° C., curves of the set flow rate and the actual flow rate show that the set flow rate agrees with the actual flow rate while the set flow rate is small. When the curve is saturated with the increase of the set flow rate and reaches to 400 cc/min or higher, however, the actual flow rate proportional to the supply quantity of the bubbling hydrogen becomes unobtainable.

The reasons for the above are that the quantity gasified by bubbling stops increasing in proportion to the discharge quantity of hydrogen because bubbles are joined together or become larger in size when the discharge quantity of bubbling hydrogen increases to a certain quantity, and further that the quantity of TBP which can be taken out as gas becomes non-proportional to the discharge quantity of hydrogen gas due to the relationship with a saturated vapor pressure. With this, the limit of the bubbling principle is shown.

Because of the fact that the decomposition temperature of the group V raw material is high and the vapor pressure of the group V element is high, it is required to supply the group V element excessively than a stoichiometric value of the grown film to the reaction chamber. Particularly, when a thin film having a large area is grown, it is required to supply a large amount of raw materials to the reaction chamber. However, it is difficult to take out TBP of the saturated vapor pressure portion at a high flow rate by bubbling as described above.

Further, it is difficult to supply raw materials stably due to instability of the takeoff quantity of the group V element by bubbling as described previously.

As a method of takeoff of a large amount of gas from a liquefied organic group V raw material, it has been proposed in the Patent Provisional Publication Number 2-255595 that gas containing a group V element is supplied directly to a reaction chamber by the vapor pressure of the organic group V raw material so as to grow a compound semiconductor film without performing bubbling.

SUMMARY OF THE INVENTION

It is an object of the present invention to provide an apparatus for forming a film in which a large amount of liquid or solid organic metal raw materials are gasified, and the gas thus obtained is supplied stably to a reaction chamber, thereby to grow a film of good quality.

According to the present invention, although the temperature of the surface is lowered by latent heat of vaporization and gas pressure is lowered in a liquid or solid organic metal raw material, the pressure is measured by a pressure gauge and the gasified quantity of the organic metal raw material is increased by the lowering portion. By varying the heating temperature of the organic metal raw material or applying ultrasonic vibration to the organic metal raw material depending on fluctuation quantity of the indicated value of the pressure gauge, the gasified quantity of the gas corrected by the fluctuation portion and fluctuation of the gas flow rate is suppressed.

Further, a large amount of organic metal raw material gas is generated by heating the organic metal raw material.

When such a measured value by the gas pressure gauge is fed back to an organic metal raw material gas generating source so as to regulate gas generation quantity, and a flow regulating valve is attached to the gas supply pipe and the flow regulating valve is controlled in accordance with a control signal of the feedback system, the gas supply quantity is still more stabilized.

DESCRIPTION OF THE PREFERRED EMBODIMENTS (First Embodiment)

Figure 4:
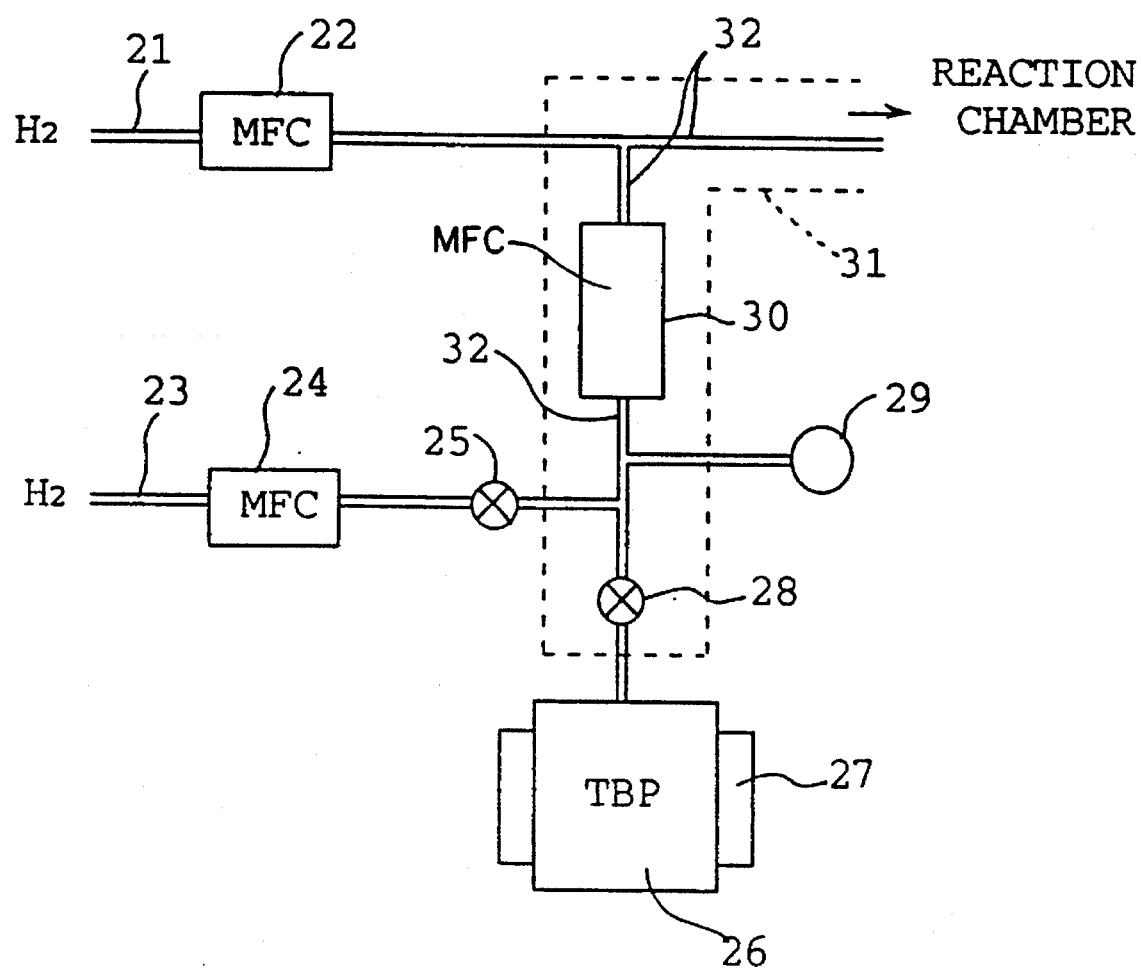
FIG. 4 is a block diagram showing a principal part of an apparatus for forming a film which is a first embodiment of the present invention.

FIG. 4 is a block diagram showing a principal part of an organic V group gas supply system used in a film growth apparatus in a first embodiment of the present invention.

In FIG. 4, a reference number 21 represents a diluting hydrogen gas supply pipe, 22 represents a mass flow controller (MFC) for diluting hydrogen gas, 23 represents a purge hydrogen gas supply pipe, 24 represents a mass flow controller (MFC) for purge hydrogen gas, 25 and 28 represent throttle valves for controlling gas flow rates, 26 represents a first cylinder for containing a TBP liquid, 27 represents a heating system for heating the cylinder, 29 represents a pressure gauge, 30 represents a mass flow controller (MFC) for TBP gas, and 31 represents a gas flow rate control section.

A gas discharge section of the first cylinder 26 is connected to a reaction chamber described later through a group V raw material gas supply pipe 32. Further, the throttle valve 28, the pressure gauge 29 and the mass flow controller 30 are fitted to the group V raw material gas supply pipe 32 in the order toward the reaction chamber. With this, a TBP supply system is formed.

The purge hydrogen gas supply pipe 23 is connected to the group V raw material gas supply pipe 32 on the gas upstream side of the pressure gauge 29 through the mass flow controller 24 and the throttle valve 25, thus forming a purge hydrogen supply system.

The diluting hydrogen gas supply pipe 21 is connected to the group V raw material gas supply pipe 32 on the output side of the mass flow controller 30 for TBP gas through the mass flow controller 22, thus forming a diluting hydrogen gas supply system for supplying diluting hydrogen gas to the reaction chamber.

With this, an organic group V raw material gas supply system is formed.

Figure 5:
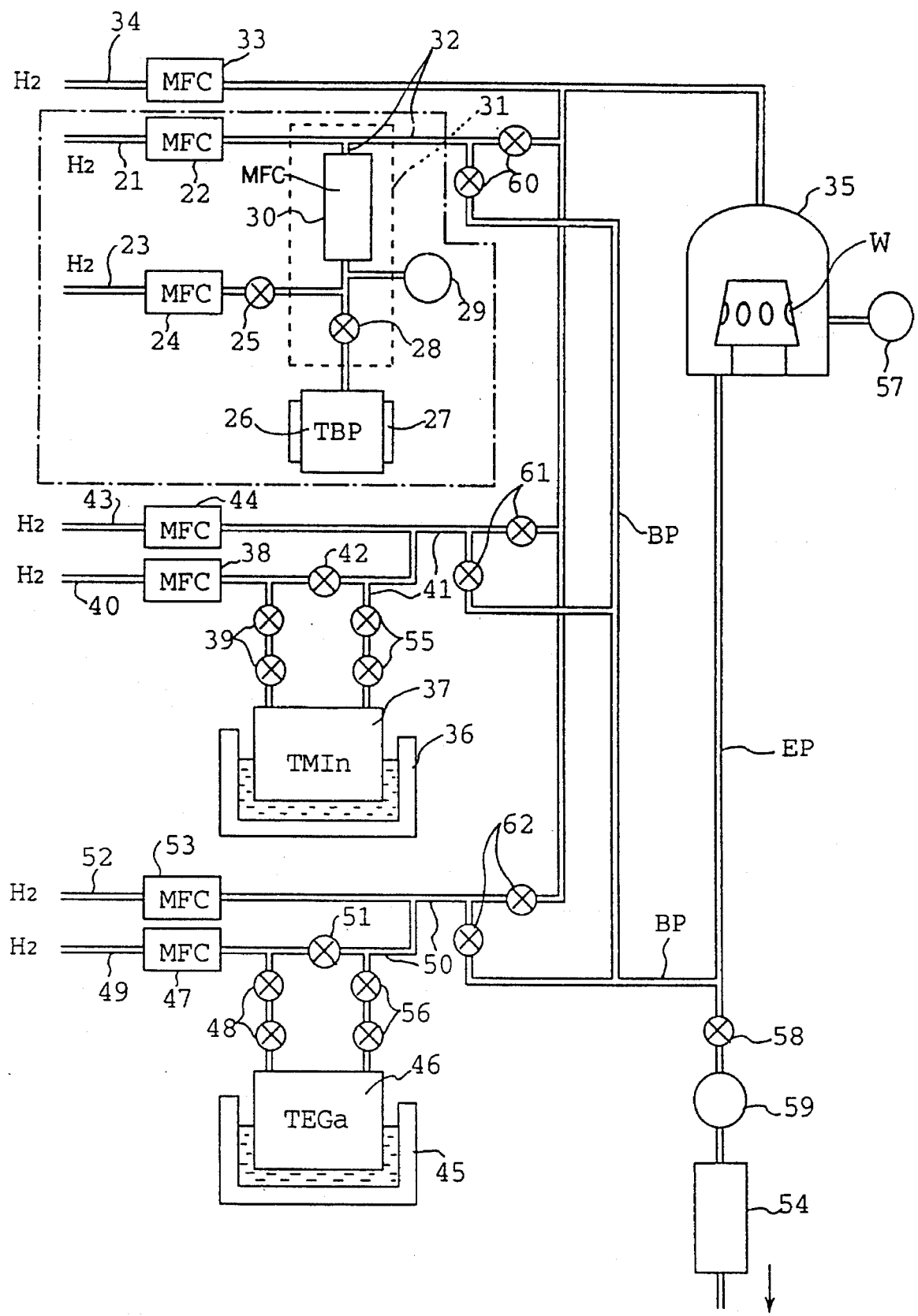
FIG. 5 is a block diagram showing the whole gas supply system of an apparatus for forming a film which is the first embodiment of the present invention.

In an apparatus for forming a film in the present embodiment, there are a main hydrogen supply system for supplying hydrogen to the reaction chamber, a TMIn supply system by a bubbling method and a TEGa supply system by the bubbling method as shown in FIG. 5 as other gas supply systems connected in parallel to the organic group V raw material gas supply system. Furthermore, an exhaust pump for sucking gas after reaction in the reaction chamber or gas bypassing the reaction chamber and a scruber for making the exhaust gas harmless are provided in the apparatus for forming a film.

The structures of these gas supply systems shown in FIG. 5 are as described below.

In the main hydrogen gas supply system, hydrogen gas is supplied from a gas supply pipe 34 to a reaction chamber 35 through a mass flow controller 33.

In an In gas supply system, a second cylinder 37 contained in a thermostatic tank 36 for storing liquefied TMIn, a first bubbling hydrogen gas supply pipe 40 inserted into the liquefied TMIn in the second cylinder 37 through a mass flow controller 38 and a throttle valve 39, and a TMIn gas supply pipe 41 for supplying TMIn gas generated in the second cylinder 37 to a reaction chamber 35 are provided. The bubbling hydrogen gas supply pipe 40 is connected to the TMIn gas supply pipe 41 through a throttle valve 42. Further, a first diluting hydrogen gas supply pipe 43 is connected to the TMIn gas supply pipe 41 through a mass flow controller 44, so that TMIn gas is diluted by diluting hydrogen gas and supplied to the reaction chamber 35.

In the Ga gas supply system, a third cylinder 46 contained in a thermostatic tank 45 for storing liquefied TEGa, a second bubbling hydrogen gas supply pipe 49 inserted into liquefied TEGa in the third cylinder 46 through a mass flow controller 47 and a throttle valve 48, and a TEGa gas supply pipe 50 for supplying TEGa gas generated in the third cylinder 46 to the reaction chamber 35 are provided. Further, a second bubbling hydrogen gas supply pipe 49 is connected to a TEGa gas supply pipe 50 through a throttle valve 51. Furthermore, a second diluting hydrogen gas supply pipe 52 is connected to the TEGa gas supply pipe 50 through a mass flow controller 53, so that the TEGa gas is diluted by diluting hydrogen gas and supplied to the reaction chamber 35.

Liquefied TMIn and TEGa are bubbled by hydrogen gas supplied through the first bubbling hydrogen gas supply pipe 40 and the second bubbling hydrogen gas supply pipe 49, respectively, and these gasified gases are supplied to the reaction chamber 35 through the TMIn gas supply pipe 41 and the TEGa gas supply pipe 50.

When gases in the TMIn gas supply pipe 41 and the TEGa gas supply pipe 50 are purged, these gases are discharged through a bypass pipe BP connected to a scruber 54 by switching throttle valves 61 and 62 so as to form a gas passage. The gas exhausted from the reaction chamber 35 passes through the exhaust pipe EP and the scrubber 54, and is discharged outside after being made harmless.

In the vicinity of the cylinders 37 and 46 among the first and the second bubbling hydrogen gas supply pipes, two each of throttle valves 55 and 56 are connected, respectively. Further, a pressure gauge 57 is fitted to the reaction chamber 35, and a pressure regulating valve 58 and an exhaust pump 59 are connected on the upstream side of the scrubber 54.

Besides, throttle valves 60, 61 and 62 for selecting either one of the flow passage to the bypass pipe 52 and the flow passage to the reaction chamber 35 and changing the flow passage are fitted to the group V raw material gas supply pipe 32, the TMIn gas supply pipe 41, the TEGa gas supply pipe 50 and the bypass pipe BP.

An example of growing an InGaP film indispensable to a high-speed semiconductor device and a laser unit of the next generation on a GaAs substrate using an apparatus for forming a film as described above and a low pressure barrel type MOCVD chamber capable of simultaneous growth of a plurality of sheets and excellent in reproducibility, and using organic metals as raw materials will be described.

In this case, liquefied TBP was used as the raw material of phosphorus (P), growth temperature of a substrate W was set to 550° C., and the growth speed was set to 2.6 Å/s. Then, the TBP liquid in the first cylinder 26 was maintained at 30° C., and the flow rate control section 31 including the throttle valve 28 and the mass flow controller 30 was raised in temperature to 50° C. higher than that of the TBP liquid by 20° C. for the purpose of preventing once gasified TBP from condensing again.

Here, the operation of the TBP gas supply system will be described. Besides, since the operation of the III group gas supply system is similar to the operation in the past, description of the details thereof is omitted.

(1) Diluting hydrogen is introduced through the diluting hydrogen supply pipe 21, and is supplied to the reaction chamber 35 after controlling the flow rate by means of the mass flow controller 22 for diluting hydrogen.

(2) The TBP gas in the first cylinder 26 generated by being heated by the heating system 27 is supplied by the vapor pressure thereof to the reaction chamber 35 through the throttle valve 28. The pressure of the TBP gas is monitored by a pressure gauge 29 located on the upstream side of the mass flow controller 30, and the gas flow rate is controlled by the mass flow controller 30 for TBP.

In this case, since the gas pressure inside the cylinder 26 increases with the rise of inside temperature, an indicated value of the pressure gauge 29 provided on the upstream side of the mass flow controller 30 for TBP reacts sensitively to the temperature of the raw material gas. Thus, it is possible to monitor minute temperature variation of the raw material gas in accordance with the indicated value of the pressure gauge 29, and the gas pressure is maintained almost constant and the gas flow rate becomes almost constant by controlling the heating temperature of the heating system 27 based on the indicated value.

On the other hand, hydrogen gas is supplied to the throttle valve 25 and the mass flow controller 30 for TBP through a purge hydrogen gas supply pipe 23 so as to purge inside gases thereof when film growth is terminated or TBP or the like is exchanged and so on, thereby to exclude organic metal raw materials detrimental to the human body so as to secure safety of an operator.

In the present embodiment, in addition to that hydrogen gas is supplied to the reaction chamber 35 through the main hydrogen gas supply pipe 34 and TBP gas is supplied to the reaction chamber 35 from the abovementioned TBP gas supply system, TMIn gas and TEGa gas are supplied to the reaction chamber 35 from the second cylinder 37 and the third cylinder 46 by the bubbling method described above.

Figure 6:
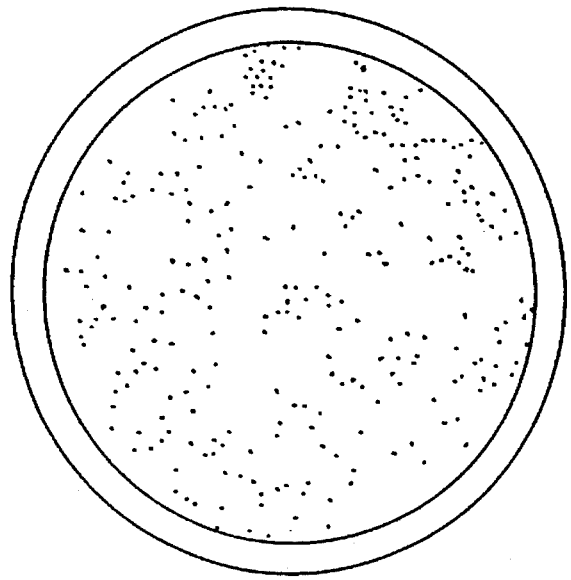
FIG. 6(A) and FIG. 6(B) are Surfscan measured views for comparing flatness of the film.
Figure 6:
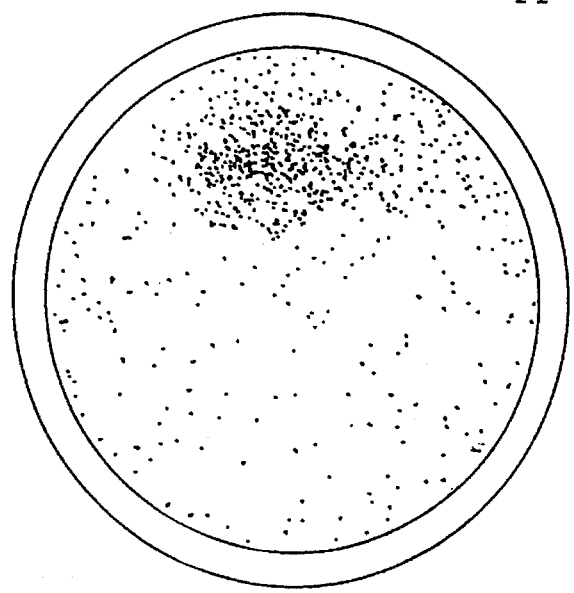

According to the present embodiment, when a thin film is grown in a short period of time, it is possible to set the takeoff flow rate of the TBP gas by one piece of organic metal cylinder to 600 cc/min, and the V/III ratio to 130, and the surface of the grown layer has a mirror surface. This is because of such a fact that the gasified quantity of TBP by means of the heating system is more than the gasified quantity by the bubbling method. The comparison between the state of the surface of the grown layer by a conventional apparatus for forming a film and the state of the surface of the grown layer by the apparatus for forming a film according to the present invention is shown in FIG. 6(A) and FIG. 6(B), and the surface has been levelled very smoothly in the present embodiment. FIG. 6(A) shows a surface state of a film obtained by the present embodiment, and FIG. 6(B) shows a surface state of a film formed by a conventional apparatus. FIG. 6(A) and FIG. 6(B) are obtained by observing the growth layer surface by Surfscan (Tencor Instruments), and a surface scattering quantity called Haze is increased when the quantity of TBP is insufficient.

Further, it has been found that the takeoff flow rate of TBP becomes unstable when the flow rate of the raw material gas is increased by the apparatus for forming a film of the present embodiment.

Figure 7:
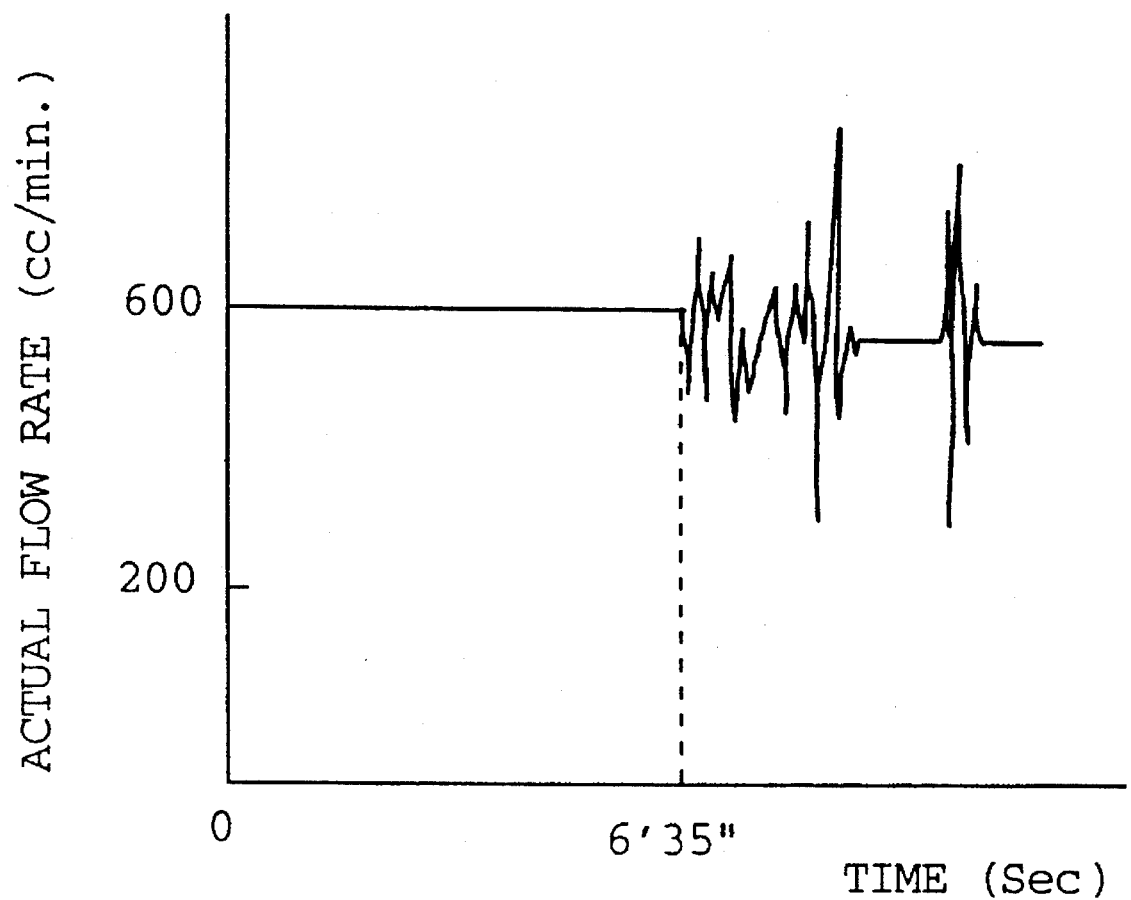
FIG. 7 is a characteristic diagram showing instability of a gas flow rate due to latent heat of vaporization from a liquefied organic V group raw material.

FIG. 7 is a diagram showing instability of the actual flow rate of the TBP gas supply system under the condition that the heating quantity by the heating system 27 is made constant independently of the indicated value of the pressure gauge 29, in which the axis of ordinates shows the actual flow rate of TBP and the axis of abscissas shows the elapsed time of film growth.

As it is seen from this diagram, the actual flow rate of TBP is very stable up to 6 minutes and 35 seconds since film growth is started. However, an unstable state of the actual flow rate of TBP is generated all of a sudden after 6 minutes and 35 seconds since a thin film is started to grow.

The cause of generation of this unstable state is as follows.

Figure 8:
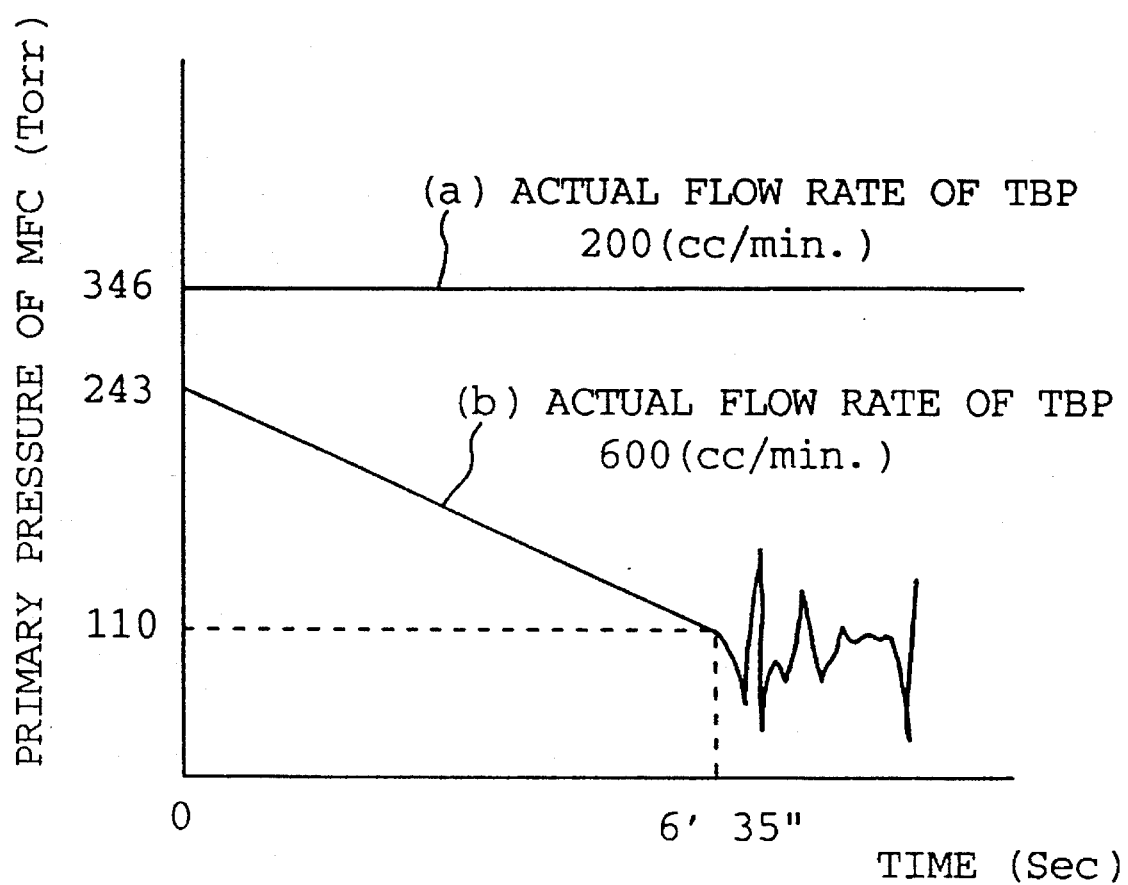
FIG. 8 is a characteristic diagram showing the difference of instability of a gas flow rate due to the difference of the gas supply quantity from a liquefied organic V group raw material.

The progress with the lapse of time of the pressure on the upstream side of the mass flow controller 30 is shown in FIG. 8. In FIG. 8, the axis of abscissas shows the lapse of time after the film is started to grow, and the axis of ordinates shows gas pressure on the upstream side of the mass flow controller 30.

In case the actual rate of the TBP gas is as low as 200 cc/min, the pressure on the upstream side of the mass flow controller 30 is not varied, but is maintained at a fixed value of 346 Torr as shown at (a) in FIG. 8.

In contrast to the above, when the actual flow rate of the TBP gas is as high as 600 cc/min, the pressure on the upstream side of the mass flow controller 30 continues to be lowered up to 6 minutes and 35 seconds with the lapse of time from the original pressure of 243 Torr as shown at (b) in FIG. 8.

The lowering of the gas pressure on the upstream side of this MFC is caused by that the temperature of the TBP liquid continues to be lowered because the quantity of heat of latent heat of gasification absorbed when TBP is changed in phase from liquid to gas cannot be supplemented sufficiently from the external heating system 27.

It is impossible to detect the lowering of temperature from the outside since it is not extended to lowering of temperature of the external heating system 27.

In the present embodiment, however, the gas pressure on the upstream side of the mass flow controller 30 is measured and the temperature of the heating system 27 is changed based on the change of the gas pressure so as to supplement quantity of heat of vaporization heat from the outside as described previously without detecting the temperature of liquefied TBP so as to control the heating temperature. With this, the variation of the flow rate of the TBP gas can be suppressed considerably.

In the present embodiment, the pressure is not stabilized completely due to the relation of TBP or heat capacity of the cylinder, but periodic variation is shown, but the influence by the variation is solved by using a MFC having specifications of operating at a low differential pressure.

A flow rate sensor section of this MFC has a thickness in an internal diameter thicker than a conventional product by 4 mm or more, and is usable at a high temperature.

In the present embodiment, it could be determined for the first time by the fluctuation of the indicated value of the pressure gauge whether a piping was stabilized, when the temperature of the piping was risen to 50° C., at that temperature or not as described previously.

Further, even when the first cylinder for TBP is maintained at room temperature, it is impossible to maintain a required flow rate unless latent heat of vaporization of a liquefied raw material is supplemented from the outside. Hence, a heating system of the cylinder for TBP was necessary.

(Second Embodiment)

Figure 9:
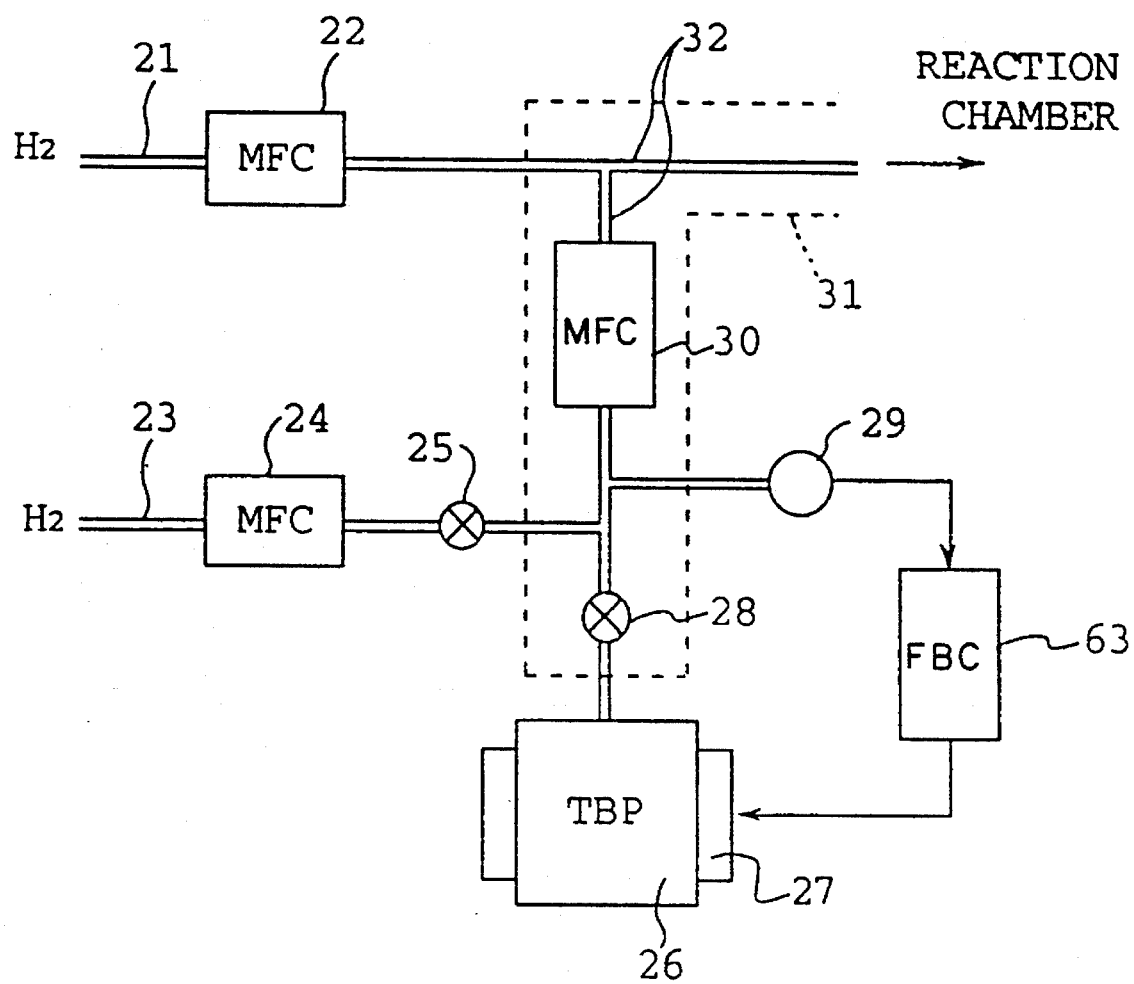
FIG. 9 is a block diagram showing a principal part of a gas supply system of an apparatus for forming a film which is a second embodiment of the present invention.

FIG. 9 is a block diagram of a principal part of an apparatus for forming a film according to a second embodiment.

In the present embodiment, the structure is the same as that of the first embodiment except an organic V group raw material gas supply system surrounded by a one-dot chain line in FIG. 5.

What differs from the first embodiment in the organic group V raw material gas supply system is that the indicated value of the pressure gauge 29 of the TBP gas supply system in the first embodiment is detected by a feedback circuit 63, and the feedback circuit (FBC) 63 maintains the vapor pressure on the upstream side of the mass flow controller 30 or controls so as to suppress fluctuation of the vapor pressure by changing the heating temperature of the heating system 27 in accordance with the fluctuation of the indicated value.

In the second embodiment, an InGaP film was also grown on a GaAs substrate W using an organic metal chemical vapor deposition method (MOCVD) as the growth method and using a low pressure barrel type MOCVD chamber capable of growing a plurality of sheets at the same time and excellent in reproducibility as the reaction chamber 35.

Further, TBP was used as the raw material of organic phosphorus (P), the growth temperature of the substrate W was set to 550° C., and the growth speed was set to 2.6 Å/s.

Since the operation method of an apparatus for growing a thin film of the present embodiment is almost similar to the operation method of the apparatus for growing a thin film in the first embodiment, description thereof will be omitted here.

In the present embodiment, the flow rate of gasified TBP from the first cylinder 26 containing TBP liquid is regulated by the mass flow controller 30, and is supplied to the reaction chamber 35. Further, the pressure on the gas upstream side of the mass flow controller 30 is detected by the indicated value of the pressure gauge 29. The feedback circuit 63 receives the gas pressure signal from the pressure gauge 29. When the pressure fluctuates to the set flow rate value, the feedback circuit 63 control the heating temperature of the heating system 27 to go back to the set gas pressure. The apparatus of the second embodiment differs in this point from the apparatus for forming a film of the first embodiment.

Figure 10:
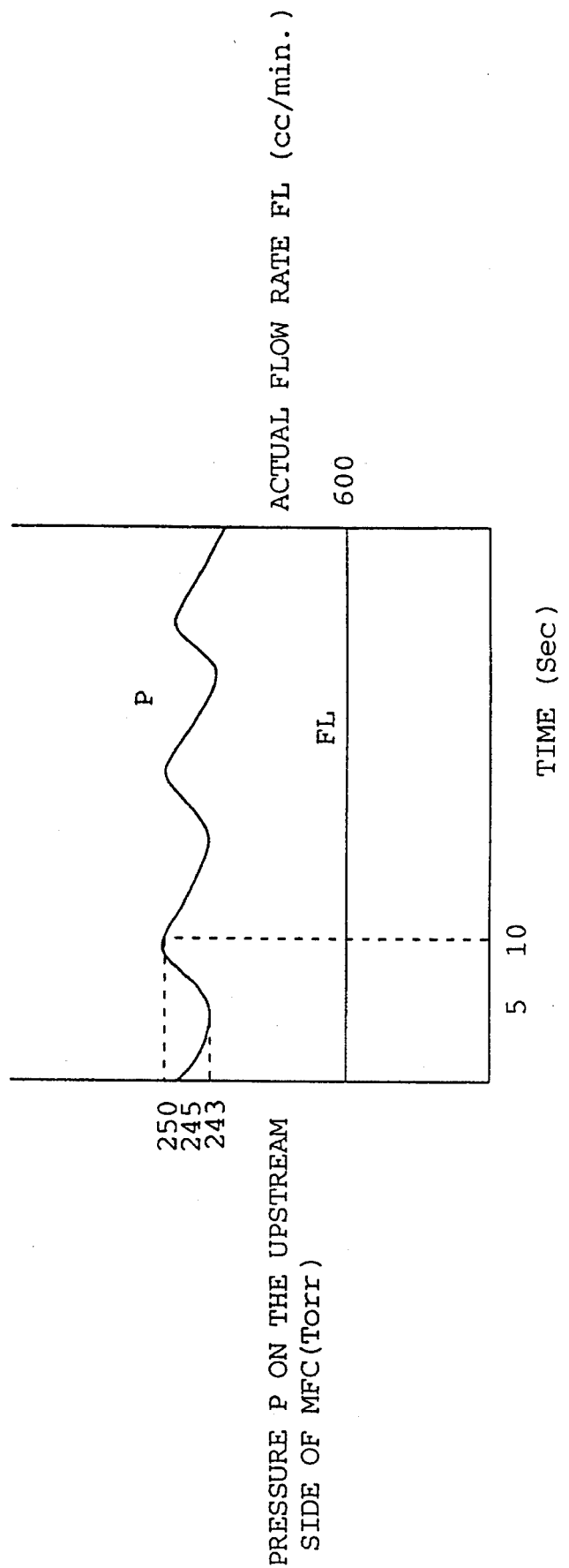
FIG. 10 is a characteristic diagram showing stability of gas by correction of gasified quantity based on a pressure gauge in an apparatus for forming a film of the second embodiment of the present invention.

FIG. 10 is a diagram showing stability of the actual flow rate of the apparatus for growing a thin film of the second embodiment.

In FIG. 10, the axis of abscissas shows elapsed time after film growth is started, and the axis of ordinates shows the gas pressure and the actual flow rate on the upstream side of the mass flow controller 30.

As it is seen in this figure, the pressure on the upstream side of the mass flow controller 30 reflects the change by the temperature of TBP sensitively. Since the feedback circuit 63 detects pressure fluctuation on the upstream side of the mass flow controller 30, and feeds it back so as to control heating quantity of the heating system 27 of the first cylinder 26 containing TBP so that the indication of the pressure gauge 29 becomes constant, the actual flow rate of the TBP gas is kept constant.

Besides, it is also possible to control the heating quantity of the heating system 27 of the cylinder 26 containing liquefied TBP so that the indication of the pressure gauge 29 shows a desired value depending on a composition of a growing thin film or the like.

(Third Embodiment)

A method of heating liquefied TBP by means of the heating system 27 in order to increase the vapor pressure of TBP contained in the first cylinder 26 has been adopted in above-mentioned respective embodiments.

However, the present applicant has tried to apply ultrasonic vibration as the other means for increasing the vapor pressure of TBP contained in the cylinder 26.

In the present embodiment, an InGaP thin film was grown on the GaAs substrate using an organic metal chemical vapor deposition method as the growth method and a low pressure barrel type MOCVD chamber capable of setting 6 sheets of 3-inch GaAs substrates and excellent in reproducibility as the reaction chamber 35.

First, conditions of growing a thin film using a conventional apparatus for forming a film corresponding to the present embodiment will be described.

Figure 1:
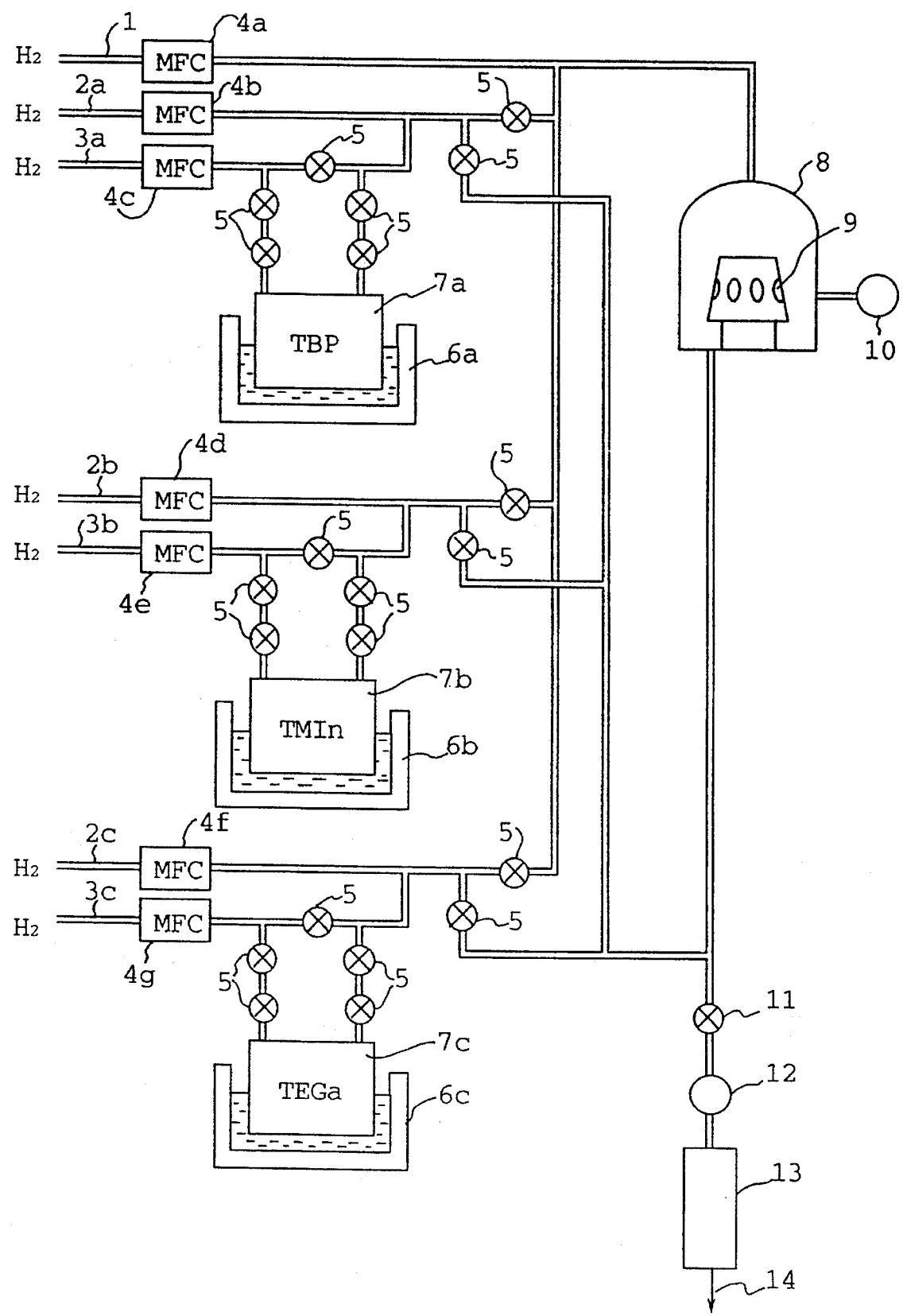
FIG. 1 is a block diagram showing a gas supply system of a conventional apparatus for forming a film.
Figure 2:
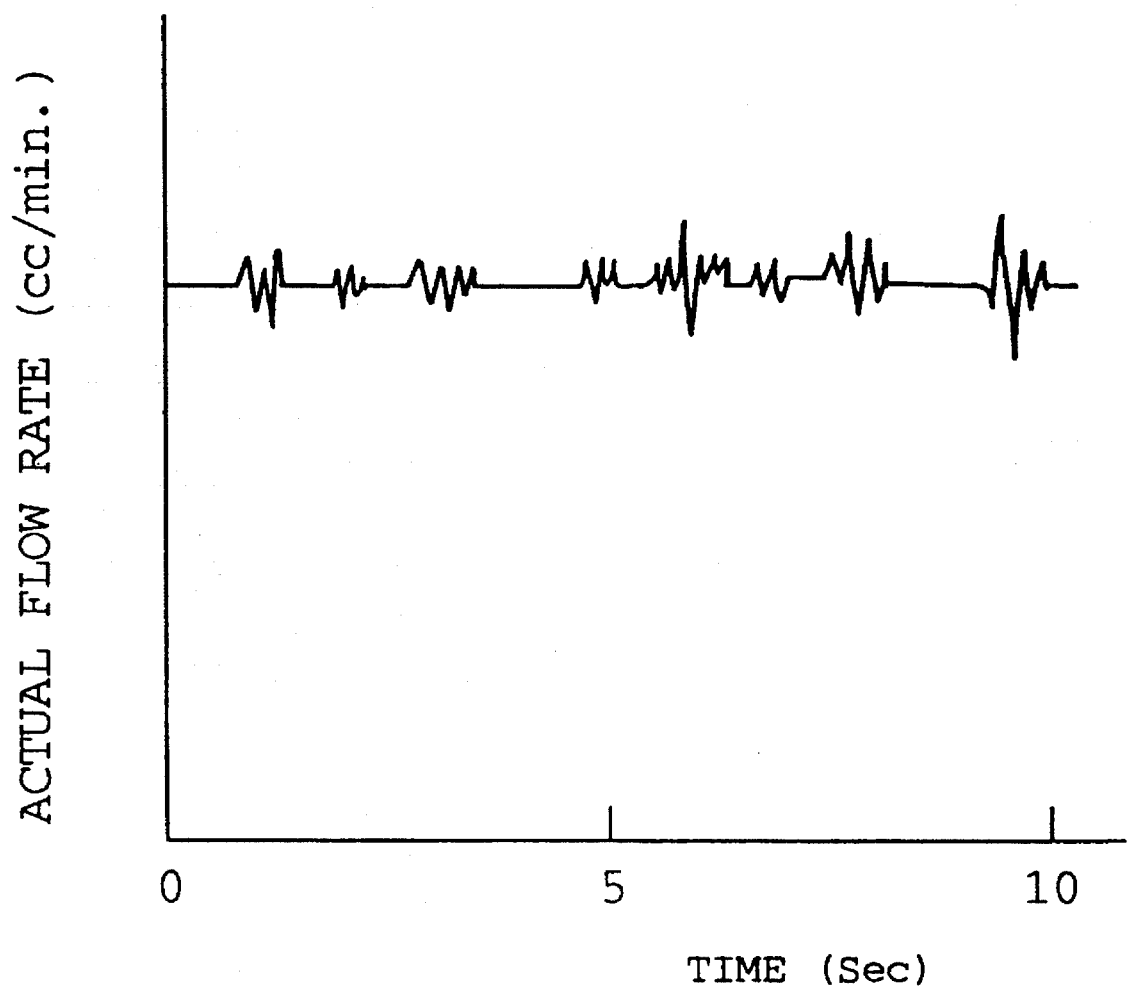
FIG. 2 is a characteristic diagram showing instability of an actual flow rate of organic V group raw material gas of a conventional apparatus for forming a film.
Figure 3:
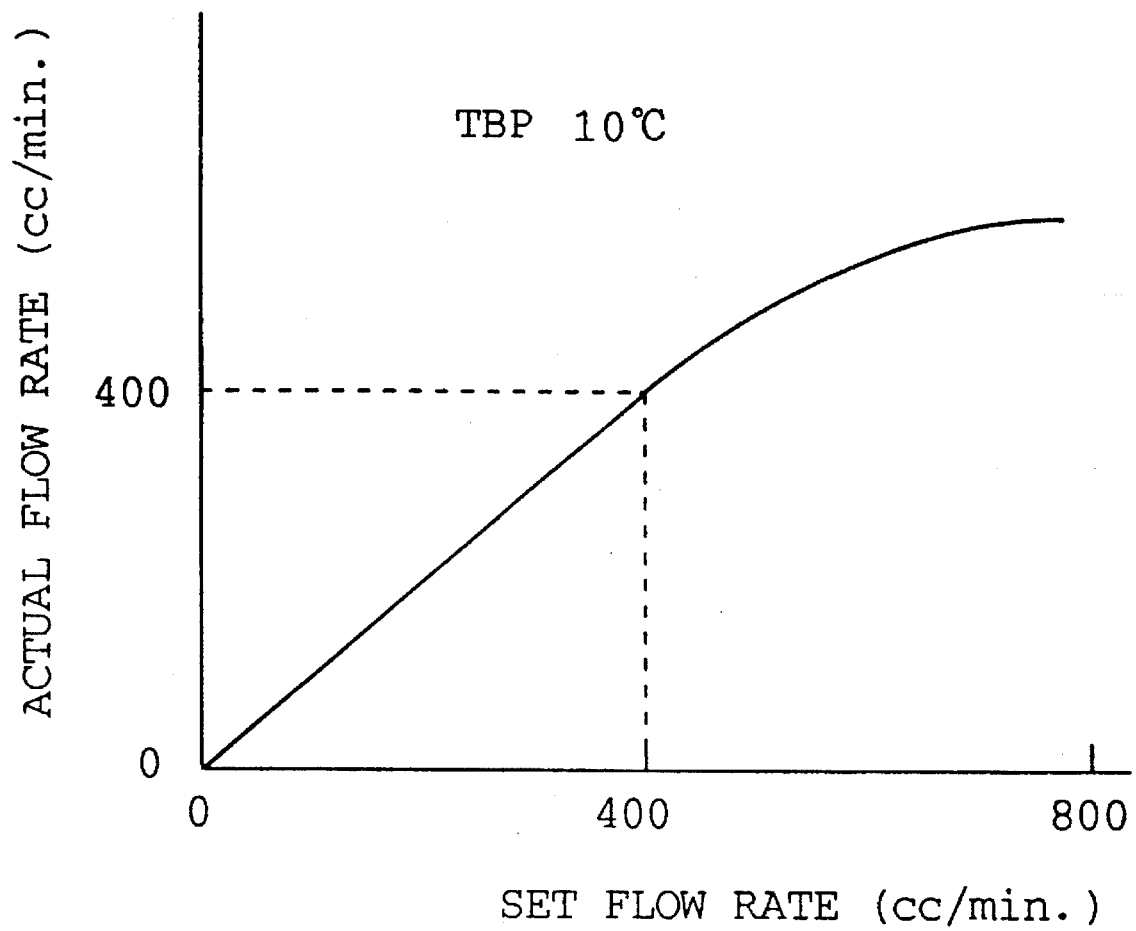
FIG. 3 is a diagram showing the relationship between a set flow rate and an actual flow rate.

The apparatus itself for forming a thin film is similar to what has been described in the opening sentences of the specification with reference to FIG. 1.

In this case, TEG which is a raw material of Ga and TMIn which is a raw material of In are maintained at 20° C., and TBP which is a raw material of phosphorus (P) is maintained at 10° C. Saturated vapor pressure of respective raw materials at these temperatures are shown. The saturated vapor pressure of TEGa is 4.4 Torr, the saturated vapor pressure of TMIn is 1.73 Torr and the saturated vapor pressure of TBP is 142 Torr.

When growth is performed under such conditions that the bubbling hydrogen supply quantity for TEG is 350 cc/min, and the bubbling hydrogen supply quantities of respective cylinders 7b and 7c for TEGa and TMIn are 500 cc/min, respectively, InGaP lattice-matching with GaAs is grown at the growth speed of 2.6 Å/min.

At this time, the V/III ratio reached to only approximately 20 even when the bubbling quantity of TBP was set to 500 cc/min, and the surface of the grown thin film becomes slightly opaque due to insufficient supply of the phosphorus raw material, which has already been described previously.

Figure 11:
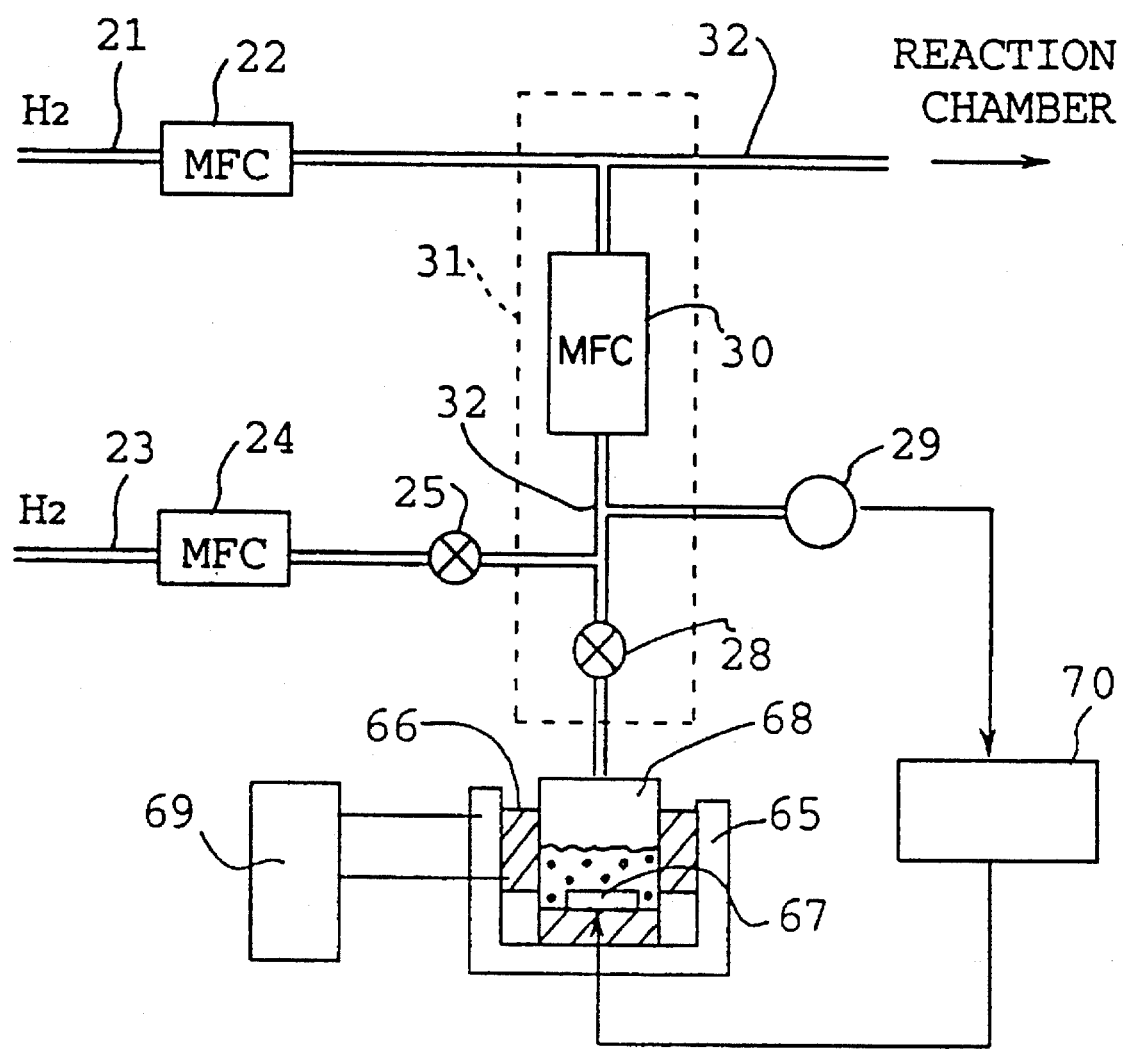
FIG. 11 is a block diagram showing a principal part of a gas supply system of an apparatus for forming a film which is a third embodiment of the present invention.

FIG. 11 is a structural explanatory diagram of a principal part of an apparatus for forming a film according to a third embodiment.

Since the present embodiment has the same structure as that of the first embodiment except an organic group V raw material gas supply system surrounded by a one-dot chain line in FIG. 5, description of the same structure is omitted here.

In this explanatory diagram, 21 represents a diluting hydrogen gas supply pipe, 22 represents a mass flow controller for diluting hydrogen gas, 23 represents a purge hydrogen gas supply pipe, and 24 represents a mass flow controller for purge hydrogen gas. Further, 25 and 28 represent throttle valves, 65 represents a thermostatic tank, 66 represents a heating system, 67 represents an ultrasonic vibrator, 68 represents a first cylinder for TBP contained in the thermostatic tank 65 and having the heating system 66 and the ultrasonic vibrator 67, 29 represents a pressure gauge, 30 represents a mass flow controller for TBP, 31 represents a flow rate control section, 69 represents a feedback circuit, and 70 represents a power source for driving the ultrasonic vibrator. 64 represents a throttle valve provided on the downstream side of the connection of the purge hydrogen gas supply pipe 23 and a group V raw material gas supply pipe 32.

The structure of the apparatus for forming a thin film of the third embodiment will be described with reference to this figure.

The apparatus for forming a thin film of the present embodiment is constructed of a diluting hydrogen gas supply system to the reaction chamber 35 composed of the diluting hydrogen gas supply pipe 21 and the mass flow controller 22 for diluting hydrogen gas, a TBP gas supply system for supplying the gas generated in the first cylinder 68 to the reaction chamber 35 through the throttle valves 28 and 64 and the mass flow controller 30 for TBP and a purge hydrogen gas supply system having the purge hydrogen gas supply pipe 23 connected to the group V raw material gas supply pipe 32 through the mass flow controller 24 for purge hydrogen and the throttle valve 25. On the upstream side of the mass flow controller 30 connected to the group V raw material gas supply pipe 32, the pressure gauge 29 is provided similarly to the second embodiment.

Further, a feedback circuit 69 for feeding back the temperature of the thermostatic tank 65 to heating power of the heating system 66 so as to maintain the temperature in the thermostatic tank 65 at a desired value is provided between the thermostatic tank 65 and the heating system 66. Further, a power source 70 for driving an ultrasonic vibrator for feeding back the indicated value of the pressure gauge 29 to the ultrasonic vibrator 67 so as to vary the vibration strength of the ultrasonic vibrator 67 is connected between the pressure gauge 29 and the ultrasonic vibrator 67.

An example in which an InGaP thin film is grown on a GaAs substrate using the apparatus for forming a film of the present embodiment will be described.

First, an experiment is performed in a state that the feedback system among the pressure gauge 29, the power source 70 for driving an ultrasonic vibrator and the ultrasonic vibrator 67 described previously is made inoperative.

Liquefied TBP was used as the raw material of phosphorus (P), the temperature of the liquefied TBP was maintained at 30° C. by means of the heating system 66 of the thermostatic tank 65, and the flow rate control section 31 was heated to 50° C. and maintained at that temperature by means of a heating system (not illustrated) in order to prevent gasified TBP from condensing on the way.

In this case, the takeoff flow rate of the TBP gas obtained from one piece of cylinder 68 for TBP was 600 cc/min and the V/III ratio was 130, but the surface of the thin film grown in this state showed a mirror surface.

However, the indicated value of the pressure gauge 29 which showed 323 Torr at time of starting growth continued to lower with the growth of the film, and the flow rate control became unstable on the way.

The cause for the above is that the temperature of the liquefied raw material surface was lowered by latent heat of vaporization when the liquid raw material is gasified and the obtained vapor pressure was decreased. However, lowering of the temperature of the liquid raw material surface does not lead to lower the temperature of the thermostatic tank 65 having the cylinder 68 for TBP. Thus, it has been impossible to maintain the gas pressure at an initial value by rising the temperature.

Thereupon, when the feedback system among the pressure gauge 29, the power source 70 for driving the ultrasonic vibrator and the ultrasonic vibrator 67 is brought into an operating state, and the power source 70 for driving the ultrasonic vibrator is controlled so that the indicated value of the pressure gauge 29 becomes constant, it has become possible to grow a thin film stably for long hours.

Figure 12:
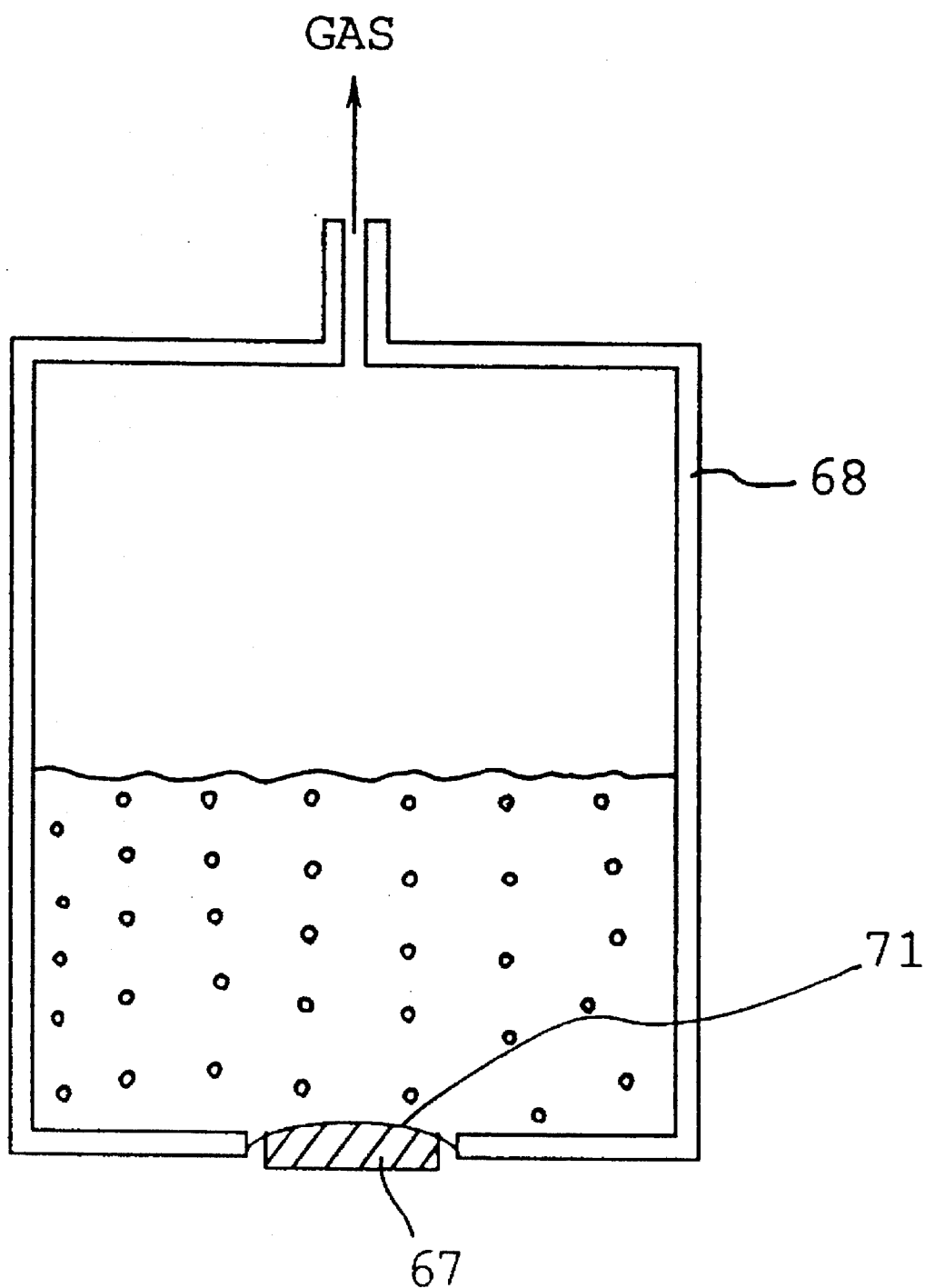
FIG. 12 is a sectional view showing an arrangement of a cylinder and an ultrasonic vibrator used in a gas supply system of an apparatus for forming a film which is the third embodiment of the present invention.

FIG. 12 is a structural explanatory view of a cylinder for TBP according to the third embodiment.

In FIG. 12, 68 represents a cylinder made of stainless steel, 71 represents a partition wall made of stainless steel and 67 represents an ultrasonic vibrator. Liquefied organic metal liquid raw material is stored in the cylinder 68.

The cylinder of the present embodiment is constructed such that a portion consisting of the thin film partition wall 71 made of stainless steel is formed on the base of the cylinder 68 made of stainless steel having a thick wall, and the ultrasonic vibrator 67 is fitted to this partition wall 71 made of stainless steel. Vibration is applied to the contained organic metal liquid raw material through the partition wall 71 made of stainless steel by means of the ultrasonic vibrator 67.

When growth of the InGaP film was started after the feedback system among the ultrasonic vibrator 67 was brought into an operating state and the frequency of the ultrasonic vibrator 67 was set to 100 KHz, the ultrasonic output of the ultrasonic vibrator 67 increased gradually from zero during growth of the film.

Figure 13:
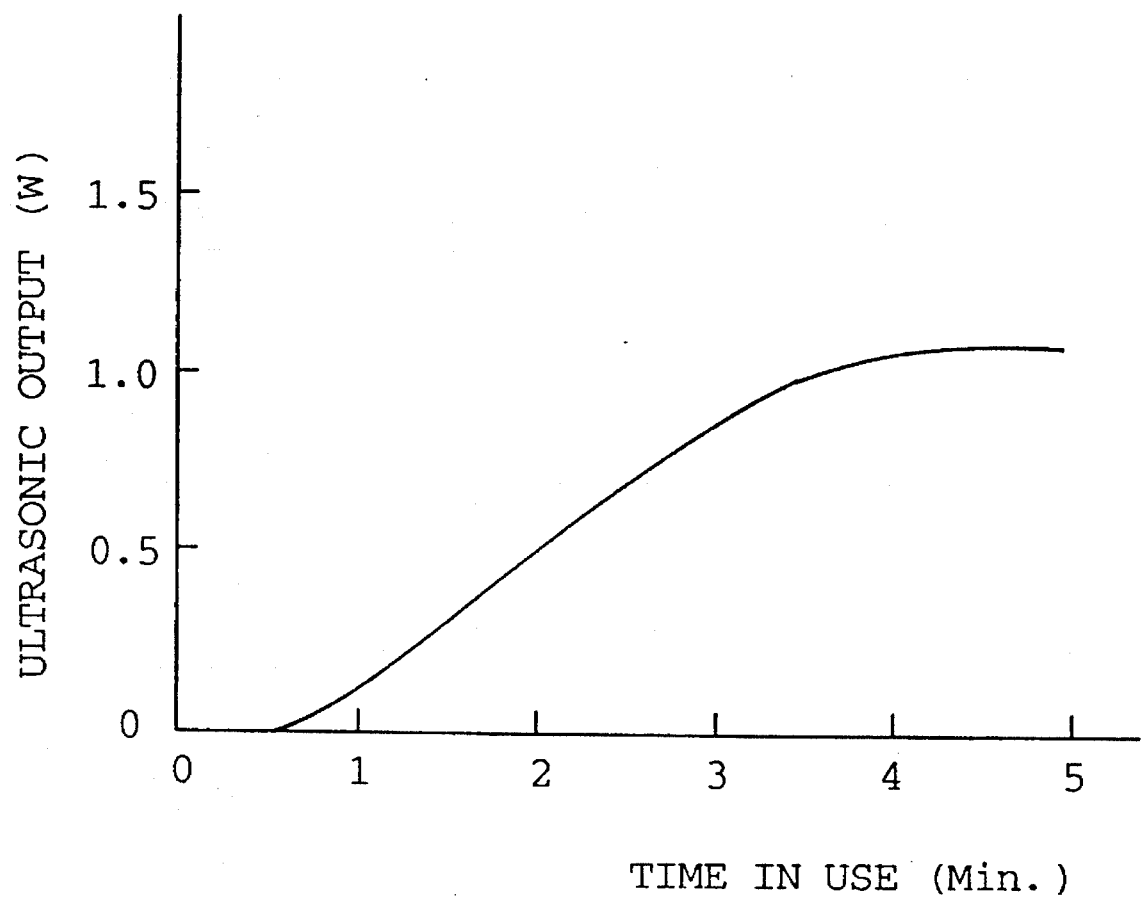
FIG. 13 is a characteristic diagram showing the relationship between film forming period of time and an ultrasonic output of an ultrasonic vibrator used in an apparatus for forming a film which is the third embodiment of the present invention.

FIG. 13 is a diagram showing elapsed variation of the output of the ultrasonic vibrator 67 during film formation.

As it is seen in this figure, the ultrasonic output of the ultrasonic vibrator 67 increased gradually from zeroW in the growth process and reached up to 1 W after 5 minutes. Lowering of temperature on the surface of the organic metal liquid raw material was not shown at the beginning of start of growth, and the ultrasonic output of the ultrasonic vibrator 67 was 0 W. Since the ultrasonic output is fed back so as to make the indicated value of the pressure gauge 29 becomes constant, however, lowering of the vapor pressure with lowering of the surface temperature of the organic metal raw material was compensated so as to increase the vapor pressure by gasifying the organic metal raw material in an atomized form by means of the ultrasonic vibrator 67.

Since the supply quantity equal to that of TBP cylinder which required 5 pieces in the conventional bubbling method has become to be able to cover with one piece, it has become possible to simplify the apparatus.

Further, safe purge is possible after growth is terminated or at time of exchanging TBP by using a purge line provided on the upstream side of the mass flow controller 30.

(Fourth Embodiment)

Figure 14:
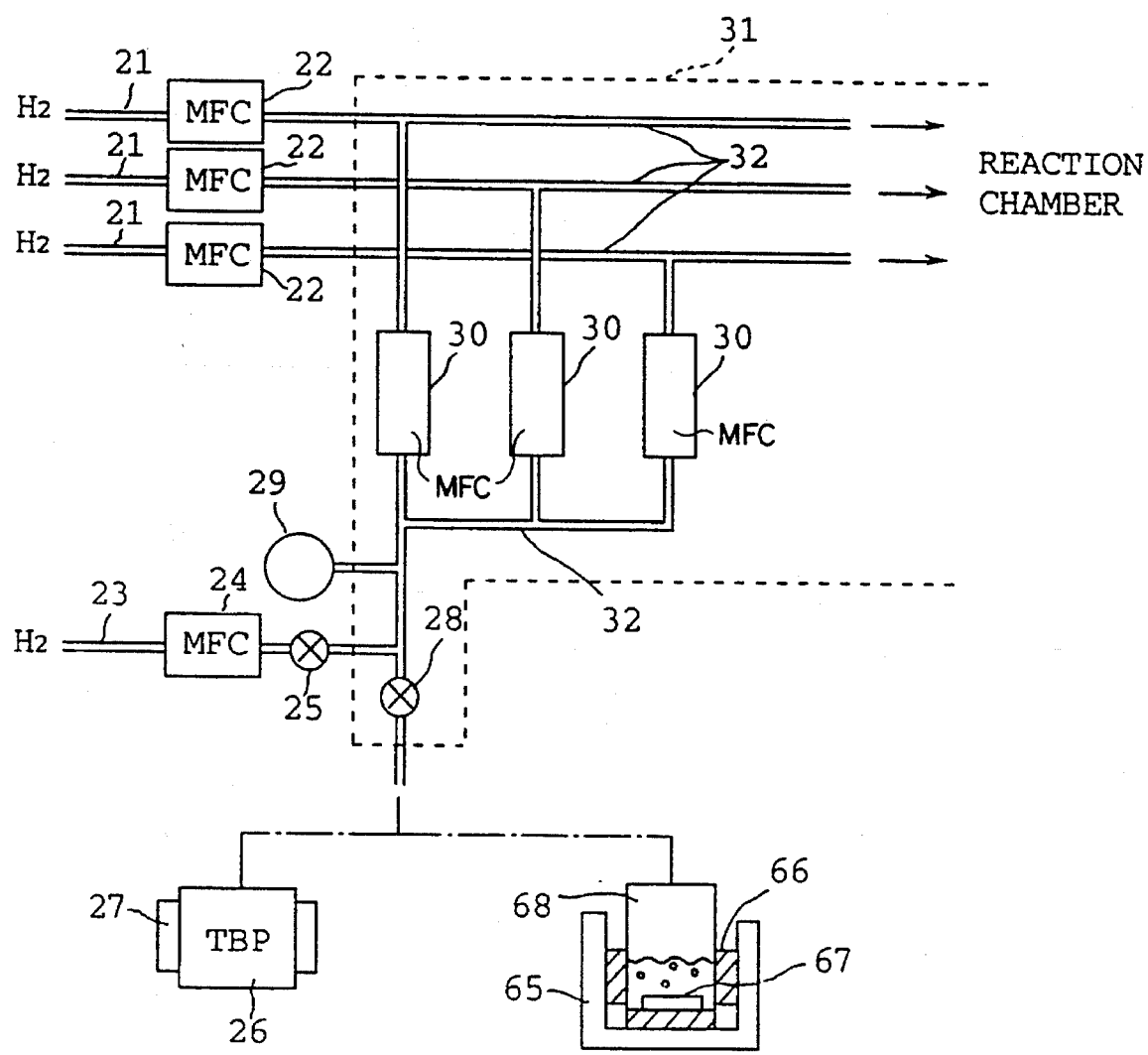
FIG. 14 is a block diagram showing a principal part of a gas supply system of an apparatus for forming a film which is a fourth embodiment of the present invention.

FIG. 14 is a structural explanatory diagram of a principal part of an apparatus for forming a film of a fourth embodiment. The present embodiment also has the same structure as that of the first embodiment except the organic group V raw material gas supply system surrounded by a one-dot chain line in FIG. 5.

The reference numerals same as those shown in FIG. 4 show the same elements in FIG. 14, and the structure thereof is as described hereunder. Besides, as a supply source of the group V raw material gas may be of such a construction that the organic group V raw material is contained in a cylinder 26 and this raw material is heated by a heating system 27 or of such a construction that an ultrasonic vibrator 67 is fitted to a cylinder 68 in a thermostatic tank.

When a hetero construction of AlGaInP/InGaP indispensable to a laser unit is formed, it is required to vary the V/III ratio largely by varying the flow rate of TBP gas abruptly. For example, the V/III ratio of AlGaInP is set to 250 and the V/III ratio of InGaP is set to 100 sometimes.

In this case, changeover in the order of one atomic layer is required. However, interruption of film growth when a layer structure is changed is unfavorable because fluctuation of an interface such as movement of atoms on the surface is caused.

Accordingly, in a conventional apparatus such as shown in FIG. 1, quantities of flow corresponding to V/III ratios, respectively, have been supplied from a plurality of mass flow controllers. In this apparatus, one mass flow controller is usually provided in one bubbler, and limitless increase in the quantity of bubblers and cost increase have been caused as the layer construction becomes more complicated.

In contrast to the above, two or more mass flow controllers are installed for one bubbler in the present embodiment.

According to the above, it is possible to supply organic V group gas of high density at a flow rate of 600 cc/min to the reaction chamber 35 from one bubbler sufficiently as shown in FIG. 10. With this, the group V raw material gas supply pipe 32 on the downstream side of the pressure gauge 29 is branched into a plurality of pipes, and a mass flow controller 30 is connected to each of respective branched group V raw material gas supply pipes 32, and at the same time, diluting hydrogen gas supply pipes 21 are connected to the group V raw material gas supply pipes 32 on the downstream side of respective mass flow controllers 30 through mass flow controllers 22 for diluting hydrogen gas as shown in FIG. 14 for instance. With this, it is possible to set the flow rate of one mass flow controller 30 to 50 cc/min, the flow rate of another mass flow controller 30 to 300 cc/min and the flow rate of the last mass flow controller 30 to 100 cc/min, thus making it possible to reduce the number of bubblers and as well as the cost. Moreover, since the gas pressure is constant, the flow rate can be changed stably even when a sudden change in the flow rate occurs.

(Fifth Embodiment)

Figure 15:
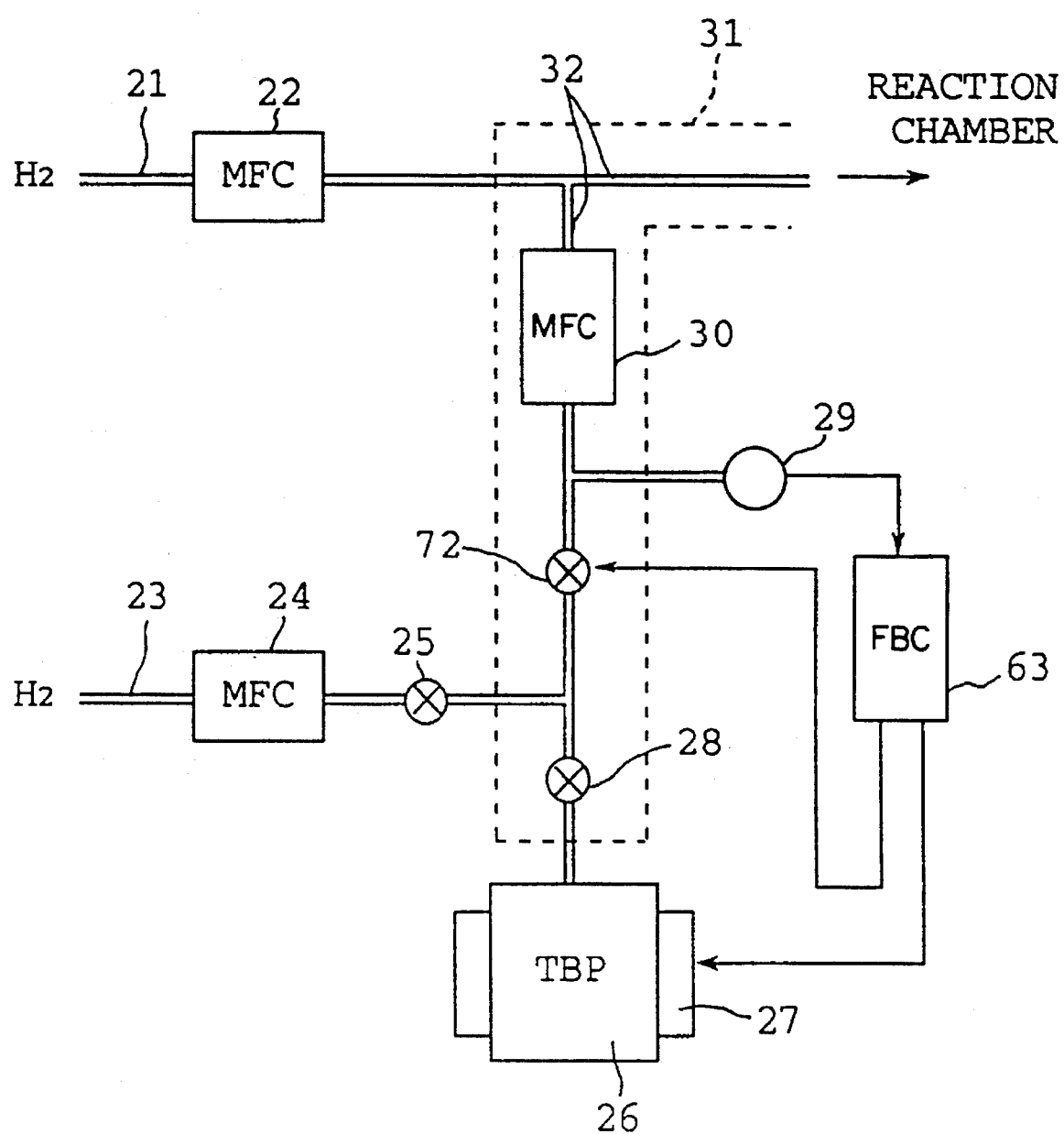
FIG. 15 is a block diagram of a principal part showing a first example of a gas supply system of an apparatus for forming a film which is a fifth embodiment of the present invention.
Figure 16:
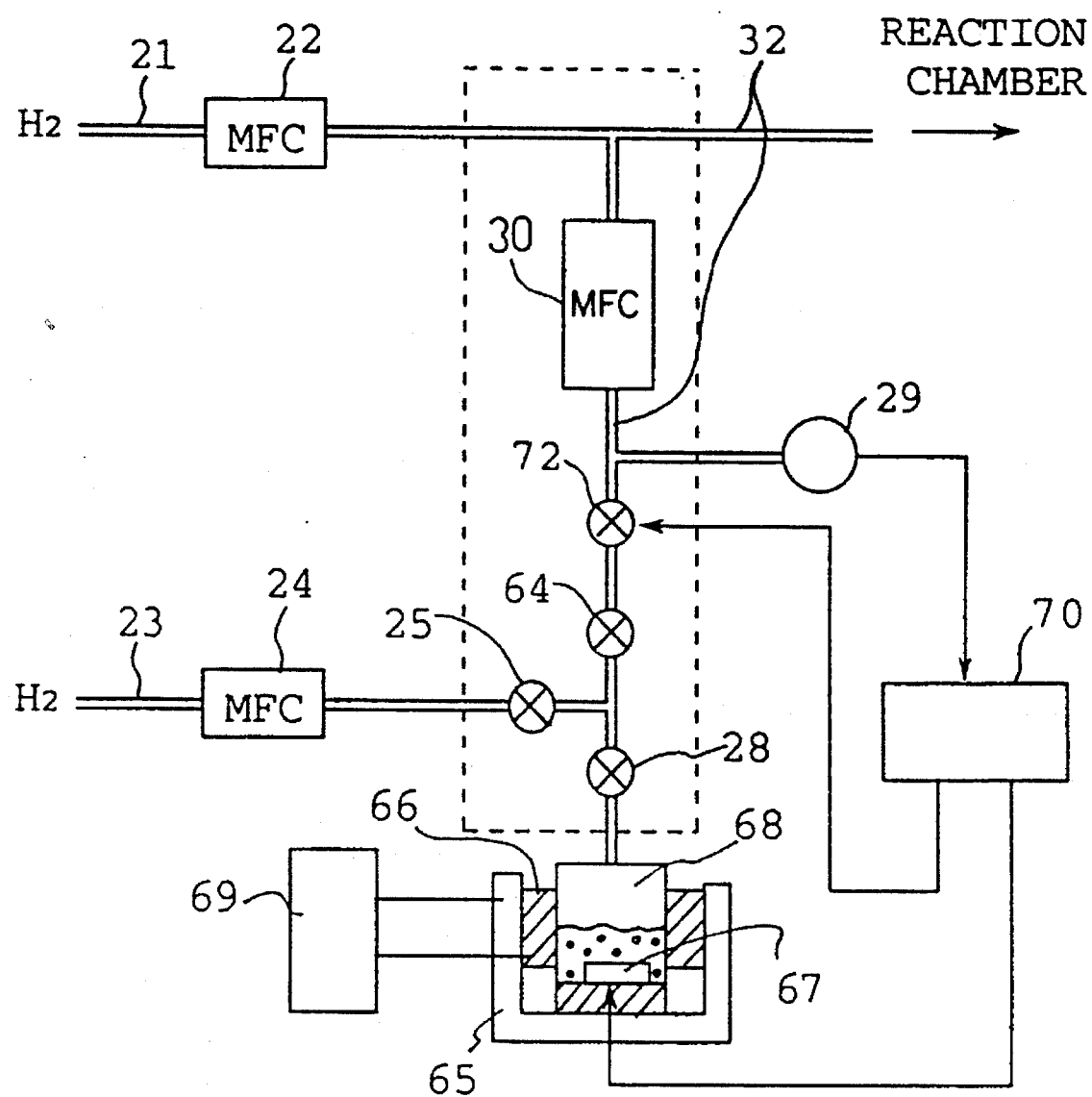
FIG. 16 is a block diagram of a principal part showing a second example of a gas supply system of an apparatus for forming a film which is the fifth embodiment of the present invention.

In the above-described respective embodiments, the pressure gauge 29 is fitted to the group V raw material supply pipe 32 located on the upstream side of the mass flow controller 30 connected to the group V raw material supply pipe 32, and the pressure thereof is maintained constant in accordance with the change of the indicated value of the pressure gauge 29 by a feedback system such as the feedback circuit 63 and the power source 70 for driving an ultrasonic vibrator, but a flow rate regulating valve 72 as shown in FIG. 15 and FIG. 16 may also be added.

For example, a flow rate regulating valve 72 is provided on the upstream side or on the downstream side of the pressure gauge 29 as shown in FIG. 15 and FIG. 16. This flow rate regulating valve has a construction such as that of a piezo valve capable of regulating the flow rate from the outside by a control signal.

The control section of the flow rate regulating valve 72 is connected to the output of the feedback circuit 63 or the power source 70 for driving an ultrasonic vibrator for regulating the flow rate of the flow rate regulating valve 72 based on a signal of the indicated value of the pressure gauge 29. The feedback circuit 63 and the power source 70 for driving an ultrasonic vibrator regulate the flow rate of the flow rate regulating valve so that the pressure gauge 29 indicates a desired value stably.

By using the flow rate regulating valve 72 having such a structure, it becomes possible to regulate the fluctuation of the heating temperature of the heating system 27 and a very small variation of the pressure which has been unable to be regulated by the output to the ultrasonic vibrator 67. For example, it is possible to dissolve instability of the gas flow rate generated when the flow passage of V group elements is switched from the reaction chamber 35 to the bypass pipe 52 or when it is switched the other way from the bypass pipe 52 to the reaction chamber 35, thus improving build up of the group V element gas when switching is made.

Besides, since other structures have been described in the second and the third embodiments, description thereof is omitted.

(Other Embodiments)

An example using a liquefied organic metal raw material has been shown in the above-described respective embodiments, but a solid organic metal raw material may also be used.

Further, the growth of a group III mixed crystal system has been described in the above-described respective embodiments, but the present invention is also applicable to the growth of a group V mixed crystal system.

Furthermore, the present invention is applicable to the growth of a binary system, a quaternary system or a penta system compound in addition to the ternary system compound adopted as an object in the above-described respective embodiments.

Not only a MOCVD chamber, but also a chloride chamber and a gas source MBE chamber may be adopted as a growth chamber in film growth such as doping in growing silicon.

Further, the heating system for heating the organic metal raw material and the ultrasonic vibration system for applying ultrasonic vibration to the organic metal raw material may be provided at the same time so that the pressure measured by the pressure gauge provided on the upstream side of the mass flow controller shows an expected value.

The mass flow controller is provided for the purpose of regulating the gas flow rate, and is not limited specifically in point of the construction.

Besides, the organic metal raw material described above is a substitution organic metal expressed by a general formula RnM, Rn-m MHm or Rn-m MX (in the formula, T represents a phenyl group, an alkyl group having 1 to 6 carbons in number, or an organic amino group, M represents a metal element of II group, III group, IV group or V group in the periodic table, H represents a hydrogen element and X represents a halogen element, where m is 1 or 2 and is an integer 1 to 3). For example, there are tertiarybutylarsine, ethylarsine, phenylarsine, trimethylarsine, triethylarsine, diethylarsine, tetraethylbiarsine, tridimethylaminoarsine, tertiarybutylphosphine, isobutylphosphine, trimethylphosphine, bisphosphinoethane and tetraethoxysilane.

What is claimed is:

1. An apparatus for generating raw material gas used in an apparatus for growing thin film, comprising:

a cylinder for containing an organic metal raw material;

a heating system for heating said organic metal raw material a gas supply pipe for supplying said organic metal raw material gasified in said cylinder to a reaction chamber;

a flow rate controller for controlling the gas supply quantity of said organic metal raw material;

a pressure gauge provided on the upstream side of the gas inflow end of said flow rate controller among said gas supply pipe; and a feedback control section suppressing lowering of said vapor pressure by regulating heating temperature of said heating system based on a pressure value measured by said pressure gauge.

2. An apparatus for generating raw material gas used in apparatus for growing thin film according to claim 1, wherein a flow rate regulating valve for suppressing fluctuation of the gas flow rate of said organic metal raw material is fitted to either on the gas upstream side or the gas downstream side of said pressure gauge, and the gas flow rate in said flow rate regulating valve is regulated based on an output control signal of said feedback control section.

3. An apparatus for generating raw material gas used in apparatus for growing thin film according to claim 1, wherein a piping for supplying purge gas is connected on the upstream side of the gas inflow end of said flow rate controller in said gas supply pipe.

4. An apparatus for generating raw material gas used in apparatus for growing thin film according to claim 1, wherein there is provided a second heating system for heating said gas supply pipe including said flow rate controller to a temperature of said organic metal raw material or higher.

5. An apparatus for generating raw material gas used in apparatus for growing thin film according to claim 1, wherein a gas supply pipe for sending the gas in said cylinder is branched into a plurality of pipes, which are connected to said reaction chamber, and a second flow rate controller is connected individually to each of branched respective gas supply pipes.

6. An apparatus for generating raw material gas used in apparatus for growing thin film according to claim 1 wherein said organic metal raw material is one of a liquid organic group V raw material and a solid organic group V raw material.

7. An apparatus for generating raw material gas used in apparatus for growing thin film, comprising:
 a cylinder for containing an organic metal raw material;
 a thermostatic tank for maintaining the temperature of said organic metal raw material through said cylinder;
 a gas supply pipe for supplying said organic metal raw material gasified in said cylinder to a reaction chamber by vapor pressure thereof;
 a flow rate controller fitted to said gas supply pipe and for controlling the gas supply quantity of said organic metal raw material;
 a pressure gauge provided on the upstream side of a gas inflow end of said flow rate controller in said gas supply pipe;
 an ultrasonic generating source for applying ultrasonic vibration to said organic metal raw material; and
 an ultrasonic generator for suppressing lowering of said vapor pressure by regulating the output of said ultrasonic generating source based on a pressure value measured by said pressure gauge.

8. An apparatus for generating raw material gas used in apparatus for growing thin film according to claim 7, wherein a flow rate regulating valve, for suppressing variation of the gas flow rate of said organic metal raw material is fitted either on the gas upstream side or on the gas downstream side of said pressure gauge, and the gas flow rate in said flow rate regulating valve is regulated based on an output control signal of said ultrasonic generator.

9. An apparatus for generating raw material gas used in apparatus for growing thin film according to claim 7, wherein a piping for supplying purge gas is connected on the upstream side of a Gas inflow end of said flow rate controller in said gas supply pipe.

10. An apparatus for generating raw material gas used in apparatus for growing thin film according to claim 7, wherein there is provided a heating system for heating said gas supply pipe including said flow rate controller to a temperature of said organic metal raw material or higher.

11. An apparatus for generating raw material gas used in apparatus for growing thin film according to claim 7, wherein a gas supply pipe for sending the gas in said cylinder is branched into a plurality of pipes, which are connected to said reaction chamber, and a second flow rate controller is connected individually to each of branched respective gas supply pipes.

12. An apparatus for generating raw material gas used in apparatus for growing thin film according to claim 7, wherein said organic metal raw material is one of a liquid organic group V raw material and a solid organic group V raw material.

13. An apparatus for generating raw material gas used in apparatus for Growing thin film, comprising:
 a cylinder for containing an organic metal raw material;
 a heating system for heating said organic metal raw material through said cylinder;
 a gas supply pipe for supplying said organic metal raw material gasified in said cylinder to a reaction chamber by vapor pressure thereof;
 a flow rate controller fitted to said gas supply pipe and for controlling the gas supply quantity of said organic metal raw material;
 a pressure gauge provided on the upstream side of a gas inflow end of said flow rate controller in said gas supply pipe;
 a feedback control section for suppressing lowering of said vapor pressure by regulating the heating temperature of said heating system based on a pressure value measured by said pressure gauge;
 an ultrasonic generating source for applying ultrasonic vibration to said organic metal raw material; and
 an ultrasonic generator for suppressing lowering of said vapor pressure by regulating the output of said ultrasonic generating source based on a pressure value measured by said pressure gauge.

14. An apparatus for generating raw material gas used in apparatus for growing thin film according to claim 13, wherein a flow rate regulating valve for suppressing variation of the gas flow rate of said organic metal raw material is fitted either on the gas upstream side or on the gas downstream side of said pressure gauge, and the gas flow rate in said flow rate regulating valve is regulated based on an output control signal of one of either said feedback control section or said ultrasonic generating source.

15. An apparatus for generating raw material gas used in apparatus for growing thin film according to claim 13, wherein a piping for supplying purge gas is connected on the upstream side of a gas inflow end of said flow rate controller in said gas supply pipe.

16. An apparatus for generating raw material gas used in apparatus for growing thin film according to claim 13, wherein there is provided a second heating system for heating said gas supply pipe including said flow rate controller to a temperature of said organic metal raw material or higher.

17. An apparatus for generating raw material gas used in apparatus for growing thin film according to claim 13, wherein a gas supply pipe for sending the gas in said cylinder is branched into a plurality of pipes, which are connected to said reaction chamber, and a second flow rate controller is connected individually to each of branched respective gas supply pipes.

18. An apparatus for generating raw material gas used in apparatus for growing thin film according to claim 13, wherein said organic metal raw material is one of a liquid organic group V raw material and a solid organic group V raw material.

* * * * *

UNITED STATES PATENT AND TRADEMARK OFFICE
CERTIFICATE OF CORRECTION

PATENT NO. : 5,460,654
DATED : October 24, 1995
INVENTOR(S) : Kikkawa et al.

It is certified that error appears in the above-indentified patent and that said Letters Patent is hereby corrected as shown below:

Col. 1, line 46, after "regulating" delete "-".
Col. 5, line 47, change "group V" to --V group--;
    line 67, change "scruber" to --scrubber--.
Col. 6, line 42, change "scruber" to --scrubber--.
Col. 12, line 23, change "1 W" to --1W--;
    line 27, change "0 W" to --0W--.
Col. 14, line 34, change "m" to --m--, after "and" insert --n--;
    line 45, after "material" insert --;--.
Col. 15, line 18, after "1" insert --,--;
    line 45, delete ",";
    line 54, change "Gas" to --gas--.
Col. 16, line 8, change "Growing" to --growing--.

Signed and Sealed this

Twentieth Day of February, 1996

Attest:

BRUCE LEHMAN

Attesting Officer      Commissioner of Patents and Trademarks